(12) United States Patent
Huang et al.

(10) Patent No.: US 11,855,154 B2
(45) Date of Patent: Dec. 26, 2023

(54) VERTICAL INTERCONNECT FEATURES AND METHODS OF FORMING

(71) Applicant: Taiwan Semiconductor Manufacturing Co., Ltd., Hsinchu (TW)

(72) Inventors: Po-Yu Huang, Hsinchu (TW); Shih-Che Lin, Hsinchu (TW); Chao-Hsun Wang, Chung-Li (TW); Kuo-Yi Chao, Hsinchu (TW); Mei-Yun Wang, Chu-Pei (TW); Feng-Yu Chang, Kaohsiung (TW); Rueijer Lin, Hsinchu (TW); Chen-Yuan Kao, Zhudong Township (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 214 days.

(21) Appl. No.: 17/392,459

(22) Filed: Aug. 3, 2021

(65) Prior Publication Data

US 2021/0367043 A1   Nov. 25, 2021

Related U.S. Application Data

(62) Division of application No. 16/408,584, filed on May 10, 2019, now Pat. No. 11,107,896.

(60) Provisional application No. 62/772,950, filed on Nov. 29, 2018.

(51) Int. Cl.
| | | |
|---|---|---|
| H01L 29/78 | (2006.01) | |
| H01L 29/40 | (2006.01) | |
| H01L 29/417 | (2006.01) | |
| H01L 21/768 | (2006.01) | |
| H01L 21/311 | (2006.01) | |
| H01L 29/423 | (2006.01) | |

(52) U.S. Cl.
CPC ...... *H01L 29/401* (2013.01); *H01L 21/31144* (2013.01); *H01L 21/7684* (2013.01); *H01L 21/76895* (2013.01); *H01L 29/41725* (2013.01); *H01L 29/4232* (2013.01)

(58) Field of Classification Search
CPC ......... H01L 29/41791; H01L 29/66795; H01L 29/785
See application file for complete search history.

(56) References Cited

U.S. PATENT DOCUMENTS

| | | | |
|---|---|---|---|
| 10,083,863 B1* | 9/2018 | Hsieh | H01L 21/32134 |
| 2014/0284671 A1 | 9/2014 | Hung et al. | |
| 2016/0149049 A1* | 5/2016 | Sharangpani | H10B 41/50 257/314 |
| 2018/0315648 A1 | 11/2018 | Ke et al. | |

(Continued)

*Primary Examiner* — Christopher A Johnson
(74) *Attorney, Agent, or Firm* — Slater Matsil, LLP (57) ABSTRACT

Vertical interconnect structures and methods of forming are provided. The vertical interconnect structures may be formed by partially filling a first opening through one or more dielectric layers with layers of conductive materials. A second opening is formed in a dielectric layer such that a depth of the first opening after partially filling with the layers of conductive materials is close to a depth of the second opening. The remaining portion of the first opening and the second opening may then be simultaneously filled.

20 Claims, 9 Drawing Sheets

(56) References Cited

U.S. PATENT DOCUMENTS

2019/0020343 A1\* 1/2019 Lee .................. H01L 29/66795
2019/0088542 A1\* 3/2019 Hsieh ................ H01L 21/76879

\* cited by examiner

VERTICAL INTERCONNECT FEATURES AND METHODS OF FORMING

PRIORITY CLAIM AND CROSS-REFERENCE

This application is a divisional of U.S. patent application Ser. No. 16/408,584 filed on May 10, 2019, and entitled "Vertical Interconnect Features and Methods of Forming," which claims the benefit of U.S. Provisional Patent Application No. 62/772,950, filed on Nov. 29, 2018, and entitled "Vertical Interconnect Features and Methods of Forming," each application is hereby incorporated by reference.

BACKGROUND

The semiconductor industry continues to increase the density of electronic components (e.g., transistors, diodes, resistors, and capacitors) and interconnect features (e.g., contacts, vias, and conductive lines) in integrated circuits (ICs) by innovations in semiconductor technology, such as multiple patterning to reduce the minimum feature-size of lines, spaces, and holes; three-dimensional transistors (e.g., the fin field-effect transistor (FinFET)), and higher number of interconnect levels. Scaling semiconductor devices to smaller dimensions increases the intrinsic speed and packing density of active electronic components. Such advancements made in designing active components may be exploited to achieve higher performance and greater functionality of integrated circuits by concurrently increasing the density of interconnect features by reducing feature-sizes at the interconnect levels while limiting the associated rise in parasitic resistance and capacitance with innovative structures, materials, and processing techniques.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure describes embodiments in the context of gate and source/drain contacts of a transistor. In general, a contact refers to a conductive path comprising one or more vertical conductive features that physically and electrically connect an electrode of an electronic device (e.g., a transistor) formed on a semiconductor substrate to a conductive element of an interconnect structure above the contacts. The example gate and source/drain contacts described herein provide such a conductive path through which electrical current may flow vertically between the gate electrode of a FinFET (a fin-shaped 3D metal-oxide-semiconductor field-effect transistor (MOSFET)) and metal-1 ($M_1$) lines. The vertical conductive features of the example contacts are inlaid in the insulating layers, referred to as interlayer dielectric (ILD) layers and interposed between the FinFET and the $M_1$ lines.

The embodiments described herein may enhance the gap-fill capabilities and lower the manufacturing cost of filling both deep and shallow openings in a dielectric layer with conductive materials by using appropriately designed multi-step gap-fill techniques. Some embodiments may be particularly advantageous to form small-diameter (e.g., about 10 nm to about 20 nm, such as about 15 nm), high aspect ratio (e.g., about 2 to about 5, such as about 3.5), vertically conducting contacts having a low contact resistance ($R_c$). In some embodiments, the low $R_c$ may be obtained by forming the contacts with vertical conductive structures without using a conductive liner. The conductive liner may increase $R_c$ because, generally, the resistivities of the liner materials are high relative to the resistivities of the conductive fill materials used in the core of the conductor. However, in some other embodiments a conductive liner may be present.

While aspects of methods of forming contacts are discussed in the context of forming gate contacts of an example multilevel interconnect system, other embodiments may utilize aspects of this disclosure with other conductive structures, other electronic devices and other multilevel interconnect systems.

Figure 1:
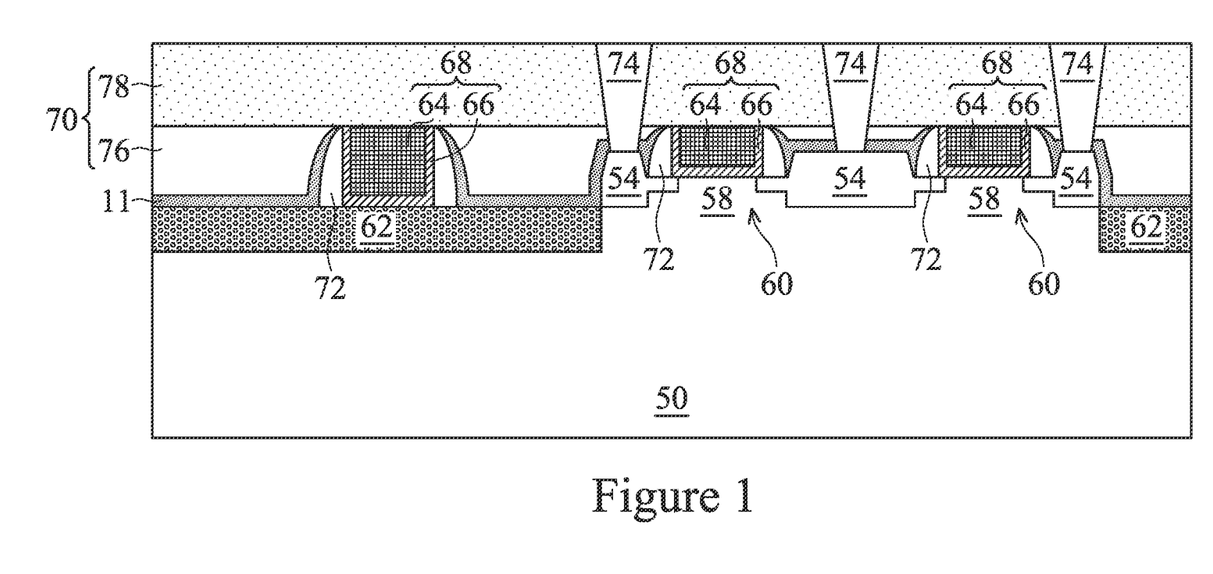
FIGS. 1 through 9 illustrate cross-sectional views of various intermediate stages of fabrication of a semiconductor device with contacts connecting gate electrodes to conductive lines, in accordance with some embodiments.

FIGS. 1-9 illustrate cross-sectional views of various intermediate stages in formation of low-$R_c$ contacts, in accordance with some embodiments. Referring first to FIG. 1, FinFET devices 60 are shown formed in fin-like strips of a semiconductor material, referred to as fins 58, protruding from a semiconductor substrate 50. The substrate 50 illustrated in FIG. 1 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon or SOI wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically silicon or glass substrate. Other substrates such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The cross-section shown in FIG. 1 is taken along a longitudinal axis of the fin 58 in a direction parallel to the direction of the current flow between the source/drain regions 54 of the FinFET devices 60. The fins, such as the fin 58, may be patterned by any suitable method. For example, the fins may be patterned using one or more photolithography processes, including double-patterning or multi-patterning processes, thereby allowing patterns to be created that have, for example, pitches smaller than what is otherwise obtainable using a single, direct photolithography process. For example, in one embodiment, a spacer image transfer (SIT) double patterning technique may be used. In the SIT technique, a sacrificial layer is formed over a substrate and patterned to form mandrels using a photolithography process. Spacers are formed alongside the mandrels using a self-aligned process. The sacrificial layer is then removed, and the remaining spacers may then be used as a hard mask to pattern the fins. FIG. 1 illustrates a single fin 58, although the substrate 50 may comprise any number of fins.

Shallow trench isolation (STI) regions 62 formed along opposing sidewalls of the fin 58 are illustrated in FIG. 1. STI regions 62 may be formed by depositing one or more dielectric materials (e.g., silicon oxide) to fill the trenches around the fins and then recessing the top surface of the dielectric materials. The dielectric materials of the STI regions 62 may be deposited using a high-density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some embodiments, the STI regions 62 may include a liner, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 62 such that an upper portion of fins 58 protrudes from surrounding insulating STI regions 62. In some embodiments, the patterned hard mask used to form the fins 58 may also be removed by the planarization process.

In some embodiments, the gate structure 68 of the FinFET device 60 illustrated in FIG. 1 is a high-k, metal gate (HKMG) structure that may be formed using a replacement gate process flow. In a replacement gate process flow, the HKMG structure 68 replaces a sacrificial dummy gate structure (not shown). After forming the STI regions 62, a dummy gate dielectric layer (e.g., silicon oxide, silicon nitride, or the like) and a dummy gate layer (e.g., amorphous silicon, polycrystalline silicon, or the like) are deposited successively using suitable deposition techniques, such as CVD, plasma-enhanced CVD (PECVD), atomic layer deposition (ALD), plasma-enhanced ALD (PEALD) or the like, or by thermal oxidation of the semiconductor surface, or combinations thereof. The dummy gate layer may be planarized (e.g., by CMP) and, after planarization, a hard mask layer (e.g., silicon nitride, silicon carbide, or the like) may be formed over the dummy gate layer using, for example, CVD, PVD, PECVD, ALD, PEALD, or the like, or a combination thereof. The dummy gate structure, comprising the dummy gate dielectric layer, the dummy gate layer, and the hard mask, is then formed by patterning the hard mask and transferring that pattern to the dummy gate dielectric layer and dummy gate layer using suitable photolithography and etching techniques (e.g., reactive ion etching (RIE)). The dummy gate structure may be formed alongside the sidewalls and tops of the fins 58 protruding above the STI 62 and extend over the surface of the STI regions 62 between the fins 58.

In some embodiments, source/drain regions 54 and spacers 72 of FinFET 60 may be formed self-aligned to the dummy gate structures. Spacers 72 may be formed after patterning the dummy gate structures. A spacer dielectric layer may be deposited using any suitable deposition technique (e.g., CVD, ALD, PVD, or the like, or combinations thereof) and may comprise one or more dielectrics, such as silicon oxide, silicon nitride, silicon oxynitride, silicon carbide, silicon carbonitride, the like, or a combination thereof. An anisotropic etch process (e.g., anisotropic RIE) removes the spacer dielectric layer from the top of the dummy gate structures leaving the spacers 72 along the sidewalls of the dummy gate structures extending laterally onto a portion of the surface of the fin (as illustrated in the right side of FIG. 1) or the surface of the STI regions 62 (as illustrated in the left side of FIG. 1).

Source/drain regions 54 are semiconductor regions on the fin 58. In some embodiments, the source/drain regions 54 may comprise heavily-doped regions and relatively lightly-doped drain extensions, or LDD regions. Generally, the heavily-doped regions are spaced away from the dummy gate structures using the spacers 72, whereas the LDD regions may be formed prior to forming spacers 72 and, hence, extend under the spacers 72 and, in some embodiments, extend further into a portion of the semiconductor below the dummy gate structure. The LDD regions may be formed, for example, by implanting dopants (e.g., As, P, B, In, or the like) using an ion implantation process. Although only one spacer is illustrated, some embodiments may utilize any number of spacers. For example, a first spacer may be formed prior to forming the LDD regions, and a second spacer may be formed after forming the LDD regions but prior to forming the heavily-doped regions. Other spacer formation techniques may be used.

The source/drain regions 54 may comprise an epitaxially grown region. For example, after forming the LDD regions, the spacers 72 may be formed and, subsequently, the heavily-doped source/drain regions may be formed self-aligned to the spacers 72 by first etching the fins to form recesses, and then depositing a crystalline semiconductor material in the recess by a selective epitaxial growth (SEG) process that may fill the recess. In some embodiments, the source/drain regions 54 may extend beyond the original surface of the fin to form a raised source-drain structures, as illustrated in FIG. 1. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method (e.g., vapor/solid/liquid phase epitaxy (VPE, SPE, LPE), or metal-organic CVD (MOCVD), or molecular beam epitaxy (MBE), or the like. A high dose (e.g., from about $10^{14}$ cm$^{-2}$ to $10^{16}$ cm$^{-2}$) of dopants may be introduced into the heavily-doped source/drain regions 54 either in situ during SEG, or by an ion implantation process performed after the SEG, or by a combination thereof.

The first interlayer dielectric (ILD$_1$ 76 in FIG. 1) is deposited to fill the spaces between dummy gate structures (not shown) and between portions of the fins 58 protruding above the STI regions 62. In some embodiments, a contact etch-stop layer (CESL) 11 of a suitable dielectric (e.g., silicon nitride, silicon carbide, or the like, or a combination thereof) may be deposited using a suitable deposition technique (e.g., CVD, PVD, ALD, PECVD, PEALD, or the like) prior to depositing the $ILD_1$ 76. The CESL 11 may be utilized as an etch-stop layer in a subsequent process used to etch openings in the $ILD_1$ 76. A planarization process (e.g., CMP) may be performed to remove the excess $ILD_1$ 76 (and any remaining hard mask material) from over the dummy gates to form a top surface wherein the top surface of the dummy gate material is exposed and may be substantially coplanar (within process variations) with the top surfaces of the $ILD_1$ 76 and the spacers 72. After exposing the top surface of the dummy gate structures, the dummy gate structures may be removed using one or more etching techniques (e.g., wet etching or dry etching, or a combination thereof), thereby creating recesses between respective spacers 72 within which the replacement gate structures are formed, as described below.

In FIG. 1, HKMG structures 68 comprising a gate dielectric layer 66 and a conductive gate layer 64 are shown occupying these recesses. The replacement gate dielectric layer 66 and the replacement conductive gate layer 64 are deposited successively to fill the recesses. The gate dielectric layer 66 may comprise one or more dielectric materials, including a high-k dielectric, in accordance with some embodiments. Examples of a high-k dielectric include an oxide or a silicate of Hf, Al, Zr, La, Mg, Ba, Ti, Pb, and combinations thereof. The gate dielectric layer 66 may be formed using any suitable deposition technique, such as CVD, remote plasma CVD (RPCVD), molecular beam deposition (MBD), atomic layer deposition (ALD), or the like.

In some embodiments, the conductive gate layer 64 may be a multilayered metal gate stack comprising a barrier layer, one or more work function layers, and a gate-fill layer formed successively on top of the gate dielectric layer 66. Example materials for a barrier layer include TiN, TaN, Ti, Ta, or the like, or a multilayered combination thereof. Example materials for a work function layer include TiN, TaN, Ru, Mo, and Al for a pMOS transistor, and Ti, Ag, TaAl, TaAlC, TiAlN, TaC, TaCN, TaSiN, Mn, and Zr for an nMOS transistor. The gate-fill layer which fills the remainder of the recess may comprise metals, such as Cu, Al, W, Co, Ru, or the like, or combinations thereof, or multi-layers thereof. The conductive gate layer 64 may be formed using CVD, RPCVD, PVD, ALD, PEALD, electroplating (ECP), electroless plating, or the like.

Excess portions of the conductive gate layer 64 and the gate dielectric layer 66 may be removed from over the top surface of the $ILD_1$ 76 using, for example a CMP process. The resulting structure, as illustrated in FIG. 1, may be a substantially coplanar surface comprising an exposed top surface of the $ILD_1$ 76, spacers 72, and remaining portions of the gate dielectric layer 66 and the conductive gate layer 64 between the respective spacers 72. The example HKMG structures 68 in FIG. 1 are formed along the tops and the sidewalls of the portion of fins protruding above the STI region 62, such as the fin 58, and may extend over the surface of the STI 62 in between fins and wrap around multiple adjacent fins, in accordance with some embodiments. The cross-sectional view at the right side of FIG. 1 illustrates examples of HKMG structures 68 on the top of the fin 58. The HKMG structure 68 illustrated in the left side in FIG. 1 is an example of an HKMG structure 68 formed over the STI region 62, such as between adjacent fins. The top of the conductive gate layer 64 may be from about 10 nm to about 35 nm above the fin 58.

A second interlayer dielectric ($ILD_2$ 78 in FIG. 1) may be deposited over the $ILD_1$ 76, as illustrated in FIG. 1. In some embodiments, the insulating materials to form the $ILD_1$ 76 and the $ILD_2$ 78 may comprise silicon oxide, phosphosilicate glass (PSG), borosilicate glass (BSG), boron-doped phosphosilicate glass (BPSG), undoped silicate glass (USG), a low dielectric constant (low-k) dielectric, such as fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the $ILD_1$ 76 and the $ILD_2$ 78 may be deposited using any suitable method, such as CVD, PECVD, ALD, PEALD, FCVD, spin-on, and/or the like, or a combination thereof. In some embodiments, the $ILD_2$ layer 78 may be planarized using a planarizing process (e.g., CMP). The final thickness of the $ILD_2$ 78 may be from about 15 nm to about 30 nm. Optionally, an etch-stop layer may be formed over the $ILD_1$ 76 prior to forming the $ILD_2$ 78, and the $ILD_2$ 78 may be formed over the etch-stop layer.

The $ILD_1$ 76 and the $ILD_2$ 78 in FIG. 1 are collectively referred to as the lower interlayer dielectric, or $ILD_L$ 70. As illustrated in FIG. 1, electrical connections to the source/drain regions 54 of the FinFETs 60 may be made by forming source/drain contact plugs 74 extending through the dielectric layers of $ILD_L$ 70 and the CESL 11 over the fin 58. In some embodiments, the source/drain contact plugs 74 may be inlaid in $ILD_L$ 70 and CESL 11, as described in greater detail below. It is understood that electrical connections to other device electrodes may be formed simultaneously using the same processing steps.

The source/drain contact plugs 74 illustrated in FIG. 1 may be formed by patterning openings (not shown) extending through the dielectric layers of the $ILD_L$ 70 and the CESL 11 using suitable photolithography and etching techniques, filling the openings with conductive materials, and removing excess conductive material from the surface by a suitable planarization technique. The openings for the source/drain contact plugs may be formed by first forming a patterned masking layer (not shown), such as a patterned photoresist layer to expose a portion of the top surface of the $ILD_L$ 70 at locations where the source/drain contact plugs 74 would be subsequently formed. An appropriate etch process may then be used to remove the $ILD_L$ 70 and the CESL 11 from the region exposed by the patterned mask. In some embodiments, the etch process may be performed in two successive stages. In the first stage, an anisotropic etch process (e.g., anisotropic RIE) may be used to remove the $ILD_L$ 70 to expose portions of the CESL 11. During the second stage of the etch process, the etchants may be switched to remove the CESL 11 to expose portions of the source/drain regions 54. Other etching methods may be used.

In some embodiments, the source/drain contact plugs 74 may include one or more conductive liners (not shown). The conductive liners may include, e.g., materials used to improve the adhesion and/or reduce out-diffusion of the conductive fill material. In some embodiments, a metal silicide region (not shown) may be formed along a surface of the fin 58 to provide a low-resistance ohmic contact with the semiconductor material of the source/drain regions 54. The metal silicide region may be formed by depositing a metal and annealing to cause a reaction between the metal and the semiconductor material. For example, if the heavily-doped semiconductor in the source/drain regions 54 is Si or $Si_xGe_{1-x}$, then the deposited metal may comprise a metal, such as Ti, Ni, Pt, Co, other suitable metals, or their alloys, which react with Si or $Si_xGe_{1-x}$ to form a conductive metal silicide. After forming the metal silicide, remaining unreacted metal material may be removed from sidewalls of the $ILD_L$ 70, or the remaining unreacted metal material may remain as part of a first conductive liner. A second conductive liner (e.g., TiN, TaN, Ta, or other suitable metals, or their alloys) may be formed over the first conductive liner. A conductive fill material (e.g., W, Ru, Co, Ni, Al, Cu, alloys of these, combinations thereof, and the like) may be deposited over the conductive liner to fill the remaining space inside the source/drain contact plug openings, using any acceptable deposition technique (e.g., CVD, ALD, PEALD, PECVD, PVD, ECP, electroless plating, or the like, or any combination thereof). Next, a planarization process (e.g., a metal CMP) may be used to remove excess portions of the conductive materials from over the surface of the $ILD_2$ 78 to form the conductive source/drain contact plugs 74 in the $ILD_L$ 70, as illustrated in FIG. 1. The planarized top surface comprises an insulating portion (e.g., the $ILD_2$ 78) and a conductive portion (e.g., the source/drain contact plugs 74). In some embodiments, the source/drain contact plugs 74 form the first of two vertical conductive features that provide a conductive path between a source/drain electrode 54 and a subsequently formed $M_1$ line. A second vertical conductive feature of a source/drain contact, referred to as a source/drain contact via, is subsequently formed vertically adjacent to the respective source/drain contact plug 74, and is in an upper interlayer dielectric ($ILD_U$) above $ILD_L$ 70, as described in greater detail below.

Figure 2:
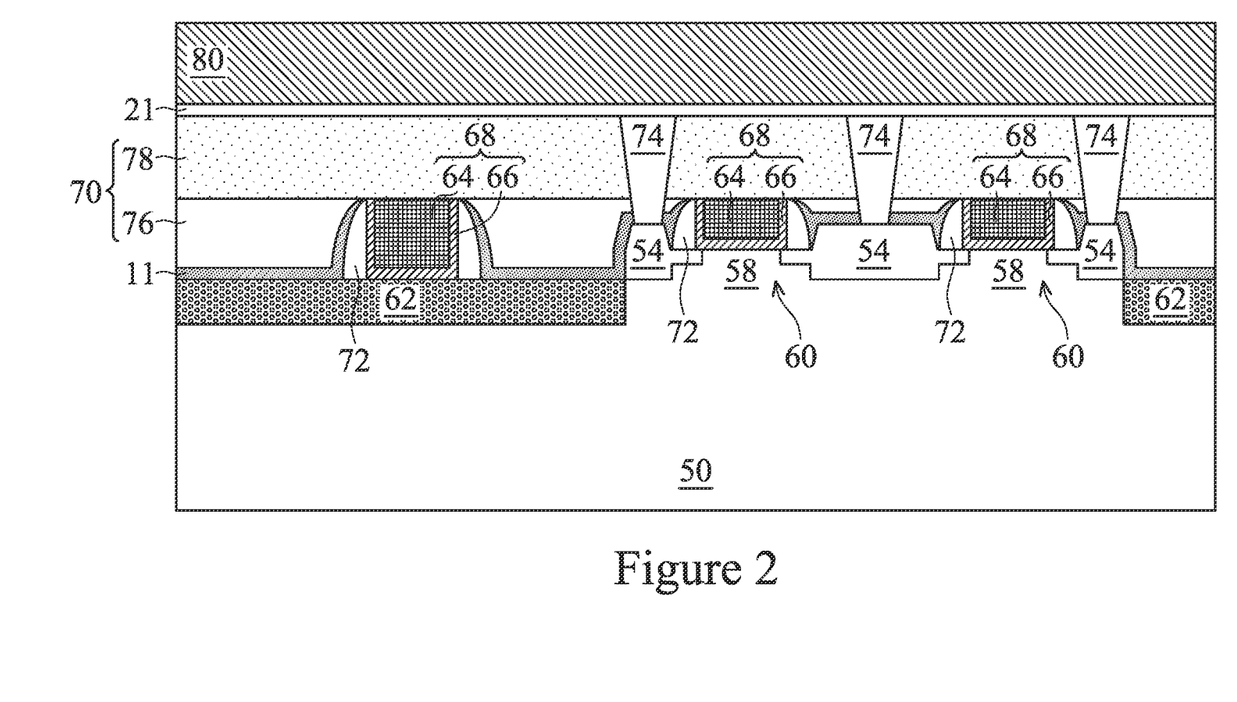

Referring now to FIG. 2, one or more insulating layers may be formed successively over the planarized top surface of the $ILD_2$ 78. In some embodiments, an etch-stop layer (ESL) 21 may be deposited over the surface, and the $ILD_U$ 80 may be formed over ESL 21. In some embodiments, the ESL 21 may have a thickness from about 5 nm to about 15 nm, and the $ILD_U$ 80 may have a thickness of about 40 nm to about 50 nm. The ESL 21 may comprise one or more insulators, such as SiN, SiCN, SiOC, AlN, AlO, combinations thereof, or the like, formed using appropriate deposition techniques, such as ALD, PEALD, PECVD, and/or the like, or a combination thereof. The materials and processes used to form the $ILD_U$ 80 may be similar to those described in the context of forming the dielectric layers of the $ILD_L$ 70.

FIGS. 3 through 8 illustrate a process flow that may be used to form gate contacts 92 connecting to the conductive gate layer 64 of the HKMG structure 68. Generally, contacts to the gate electrodes (e.g., the conductive gate layer 64) of MOSFETs (e.g., the FinFETs 60) are formed over isolation regions, such as the STI region 62. However, it is understood that aspects of the methods for forming gate contacts described herein may be applied to form gate contacts connected to gate electrodes formed over an active region, for example, the conductive gate layer 64 formed over the fin 58, illustrated in the right side of FIGS. 1 through 9.

Figure 3:
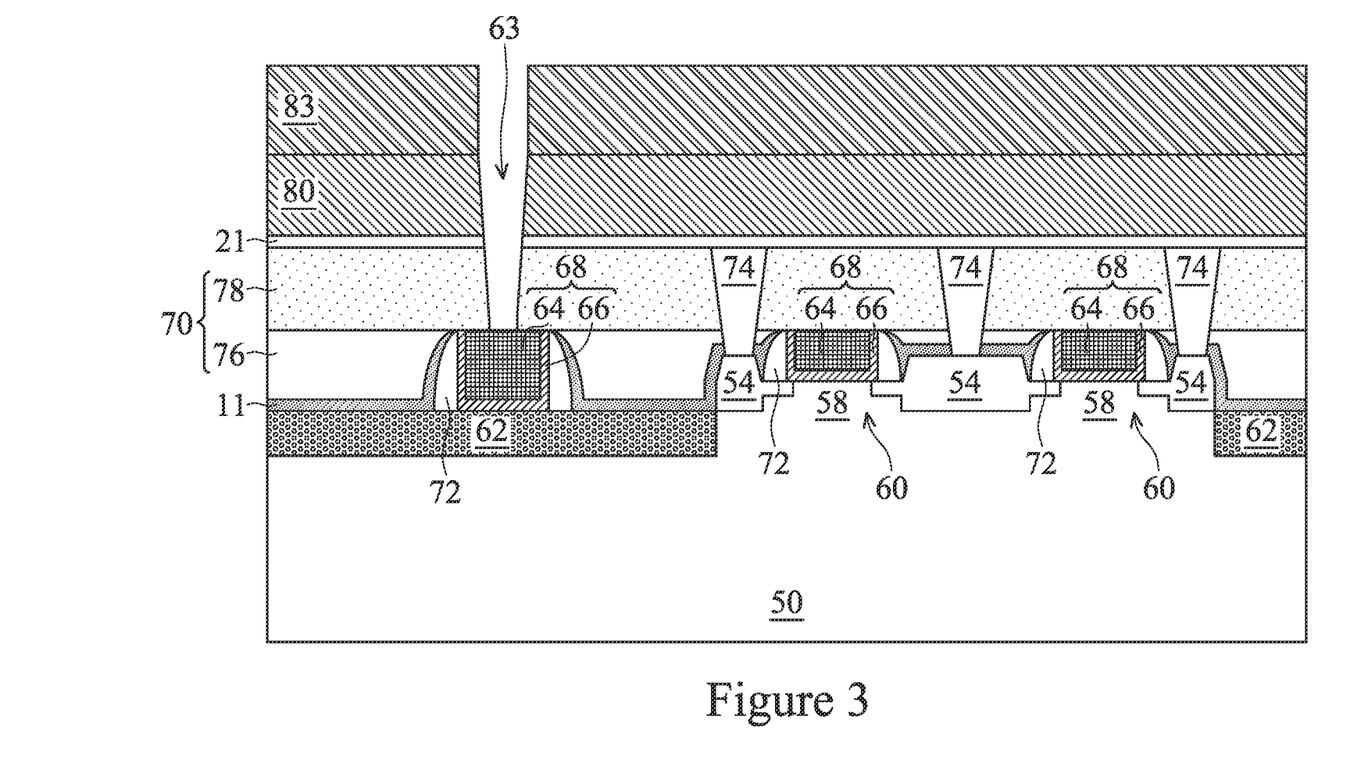

Referring now to FIG. 3, a first opening 63 is shown extending through the dielectric films $ILD_U$ 80, ESL 21, and $ILD_L$ 70 to expose a portion of the top surface of the conductive gate layer 64. In some embodiments, a width of the first opening 63 may be between about 12 nm and about 18 nm and the sidewall angle may be between about 85° and 89°, in accordance with the patterning process capability. An anisotropic RIE may be utilized to remove portions of the dielectric materials of the $ILD_U$ 80, the ESL 21, and the $ILD_L$ 70 over a portion of, e.g., the conductive gate layer 64 exposed by a mask 83 (e.g., a patterned photoresist layer). The etching process may comprise several steps where, in each step, etchants may be switched according to the chemical properties of the various dielectric materials. For example, a three step etch sequence may be used where, in the first step the $ILD_U$ 80 may be removed using the ESL 21 as a stopping layer; in the second step the etching time may be adjusted to remove the ESL 21; and in the third step the $ILD_L$ 70 may be removed using the conductive gate layer 64 as a stopping layer. After the etching process is complete, the mask 83 may be removed using, for example, an oxygen plasma ash technique.

Figure 4:
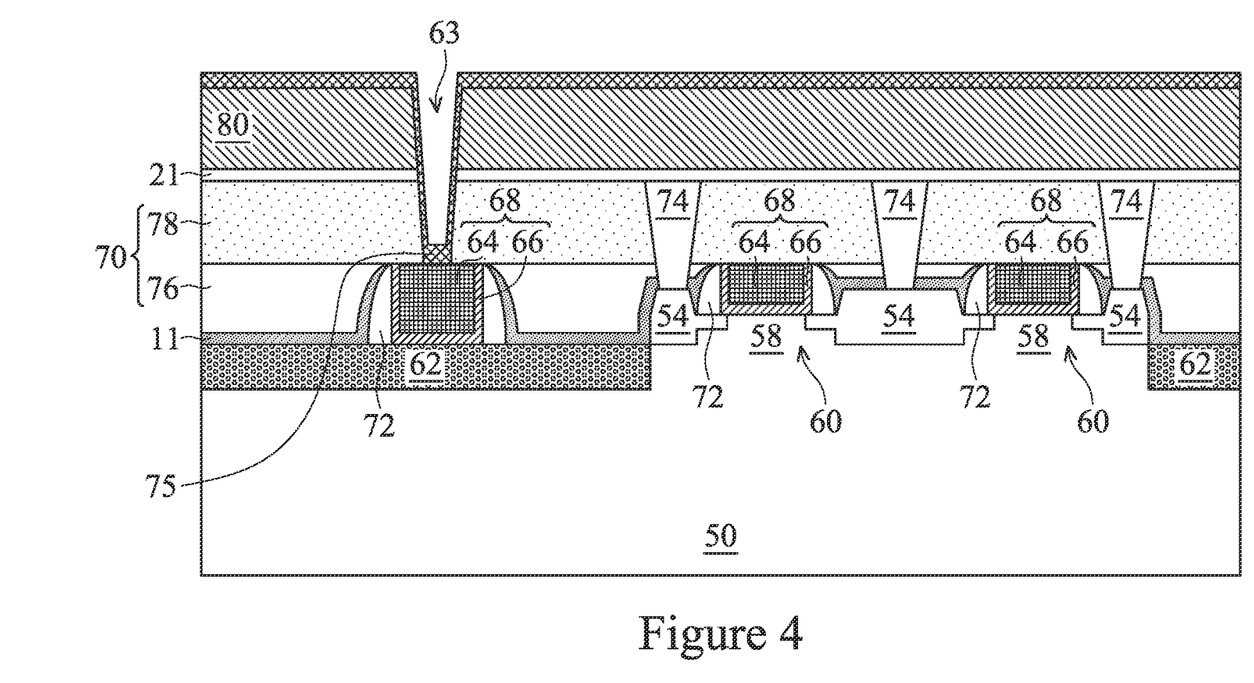

In FIG. 4, a first conductive material 75 may be deposited to form a conductive film that covers the top surface of $ILD_U$ 80, the bottom surface and the sidewalls of the first opening 63. In some embodiments, the conductive material deposited to form the first conductive material 75 may comprise, for example, Ti, or TiN, or a combination thereof, using a suitable technique (e.g., PVD, or CVD, or a combination thereof) to form a conductive film of about 4 nm to about 8 nm thick on the top surface of $ILD_U$ 80 and at the bottom of the first opening 63. For example, a Ti layer may be deposited first using a PVD technique and a TiN layer may be deposited over the Ti layer to form a Ti/TiN layer of the first conductive material 75. The sidewalls may be lined with a relatively thinner film of the first conductive material 75 (e.g., about 1 nm to about 3 nm thick). In some embodiments, the portions of the first conductive material 75 formed on the top surface of the $ILD_U$ 80 and along the sidewalls of the first opening 63 may be removed. Other materials and other deposition techniques may also be used, such as depositing a film of Ti using PVD, followed by a $N_2$ treatment to form a Ti/TiN surface layer. The $N_2$ treatment may be a plasma process. The plasma process may be using $N_2$ gas at a pressure of about 10 mTorr to about 1 Torr, and a temperature of about 400° C. to about 450° C., an RF power from about 1 kW to about 2 kW, at a frequency of about 2 MHz to about 13.56 MHz.

Figure 5:
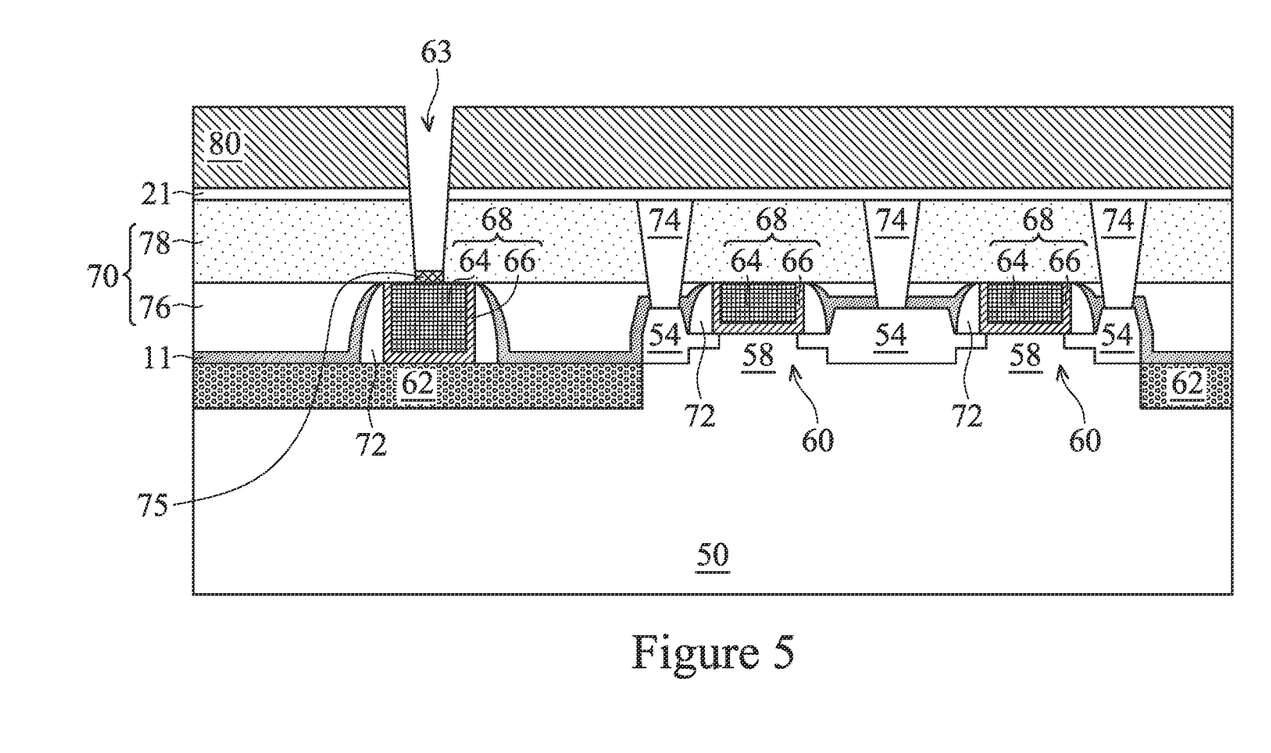

As illustrated in FIG. 5, in some embodiments, portions of the first conductive material 75 on the top surface of $ILD_U$ 80 and along the sidewalls of the first opening 63 may be removed by using, for example, a two-part etch process. In the first part of the two-part etch process, an etch-back technique may be performed to expose the top surface of $ILD_U$ 80 while a protective film of a flowable material, e.g., a photoresist, or the like, (not shown) protects the conductive surfaces at the bottom and along a portion of the sidewalls lined with the first conductive material 75 inside the first opening 63. The exposed conductive material may be removed by wet chemical etchants, such as $H_2O_2$. In the second part of the etch process, the protective film is removed (e.g., by ashing the photoresist with oxygen plasma) and the surface may be exposed again to wet chemical etchants for a time period adjusted to remove the thin lining of the first conductive material 75 on the sidewalls, but leave a film of first conductive material 75 at the bottom of the first opening 63. At the end of the etch process, about 2 nm to about 5 nm thick conductive film of first conductive material 75 remains at the bottom of the first opening 63. FIG. 5 illustrates a cross-sectional view of the structure after the first conductive material 75 has been formed and any surface treatment has been completed.

Figure 6:
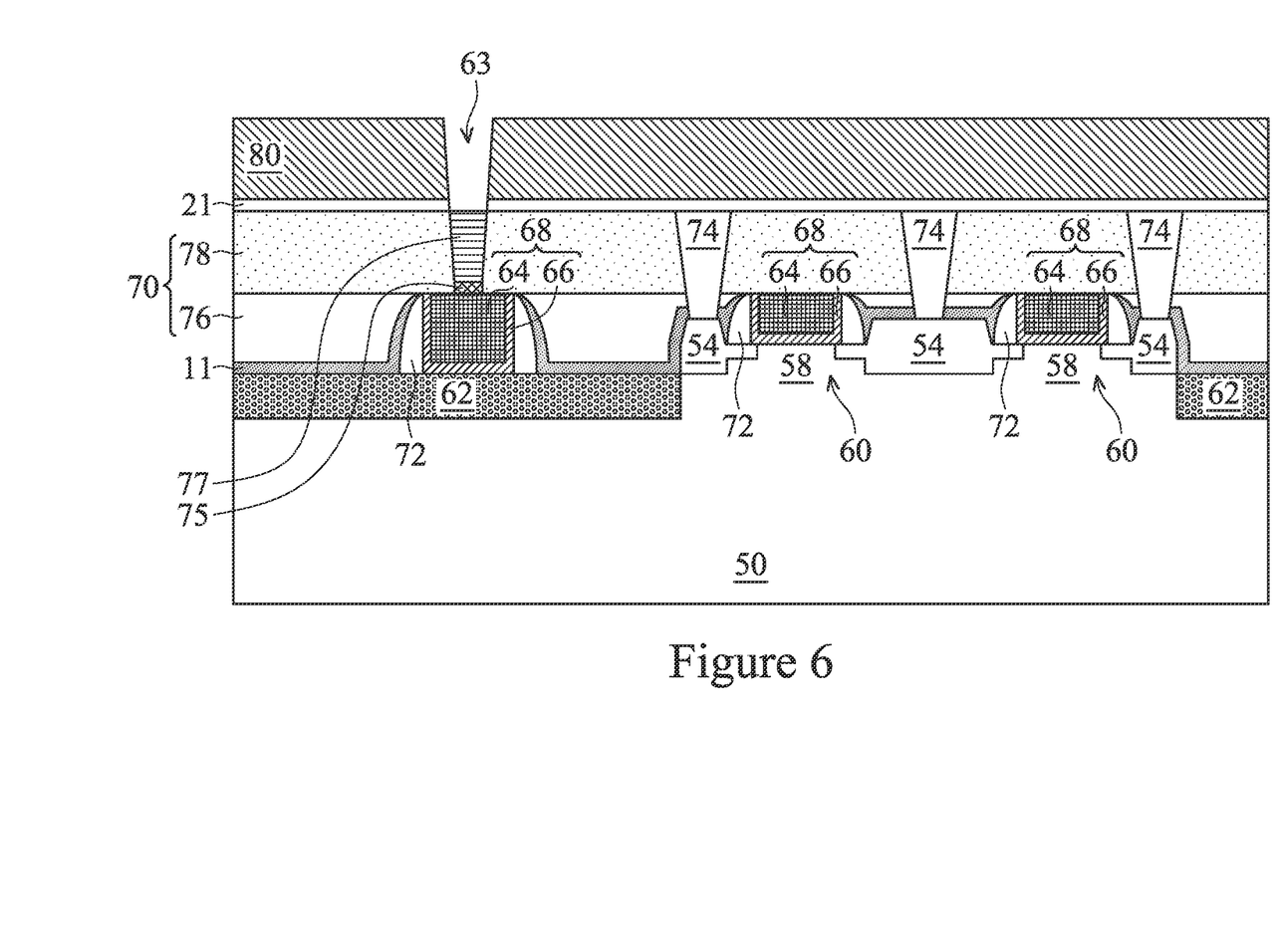

FIG. 6 illustrates a second conductive material 77, deposited over the first conductive material 75 formed at the bottom of the first opening 63. The second conductive material 77 may be formed selectively over the first conductive material 75 using, for example, an ALD process during which the conductive film of the second conductive material 77 may grow vertically to further increase the height of the conductive material within the first opening 63. In the example illustrated in FIG. 6, there is no liner included along sidewalls of the ILD$_2$ 78, between the ILD$_2$ 78 and one or both of the first conductive material 75 and the second conductive material 77. Omitting the liner may allow for a lower resistance contact to be formed. It is understood that while, in the example illustrated in FIG. 6, the ALD technique has been used to form the partially-filled contact structure, in some other embodiments, other deposition methods such as, selective CVD may be used to form a similar structure.

The conductive surface of the first conductive material 75 in the example in FIG. 6 may comprise TiN and the second conductive material 77 may comprise tungsten (W) deposited selectively on TiN using, for example, an ALD technique, in accordance with some embodiments. The first atomic layer of W is formed on the TiN surface using a sequence of two self-limiting surface reactions. The precursor gas used in the first reaction step may include for example, WCl$_5$ and a carrier gas (e.g., Ar) with a flow rate of about 100 sccm to about 1000 sccm. The reaction chamber may be at a pressure of about 1 Torr to about 60 Torr, and a temperature of about 400° C. to about 500° C. The precursor gas used in the second reaction step may include for example, H$_2$ or SiH$_4$, with a flow rate of about 10000 sccm to about 16000 sccm, and a carrier gas (e.g., Ar) with a flow rate of about 100 sccm to about 1000 sccm. The reaction chamber may be at a pressure of about 1 Torr to about 60 Torr, and a temperature of about 400° C. to about 500° C. The reaction chamber is purged after each reaction step.

After the first atomic layer of W is formed on the TiN surface, each subsequent layer of W is deposited on a W surface. A different sequence of two self-limiting surface reactions may be performed to deposit the second atomic layer of W. The precursor gas used in the first reaction step may include, for example, WCl$_5$ gas and a carrier gas (e.g., Ar) with a flow rate of about 100 sccm to about 1,000 sccm. The reaction chamber may be at a pressure of about 1 Torr to about 60 Torr, and a temperature of about 400° C. to about 500° C. The precursor used in the second reaction step may include H$_2$ with a flow rate of about 10,000 sccm to about 16,000 sccm, and a carrier gas (e.g., Ar) with a flow rate of about 100 sccm to about 1000 sccm. The reaction chamber may be at a pressure of about 1 Torr to about 60 Torr, and a temperature of about 400° C. to about 500° C. The reaction chamber is purged after each reaction step. This sequence, along with a purge step after each reaction step, constitutes one cycle of the ALD deposition process. The number of ALD cycles may be adjusted to grow a target thickness of the second conductive material 77 with atomic layer control. In some embodiments, the target thickness is selected such that the top surface of the second conductive material 77 is substantially level with an upper surface of the ILD$_2$ 78, within process variations. In some embodiments the upper surface of the second conductive material is within 5 nm of the upper surface of the ILD$_2$ 78.

Figure 7:
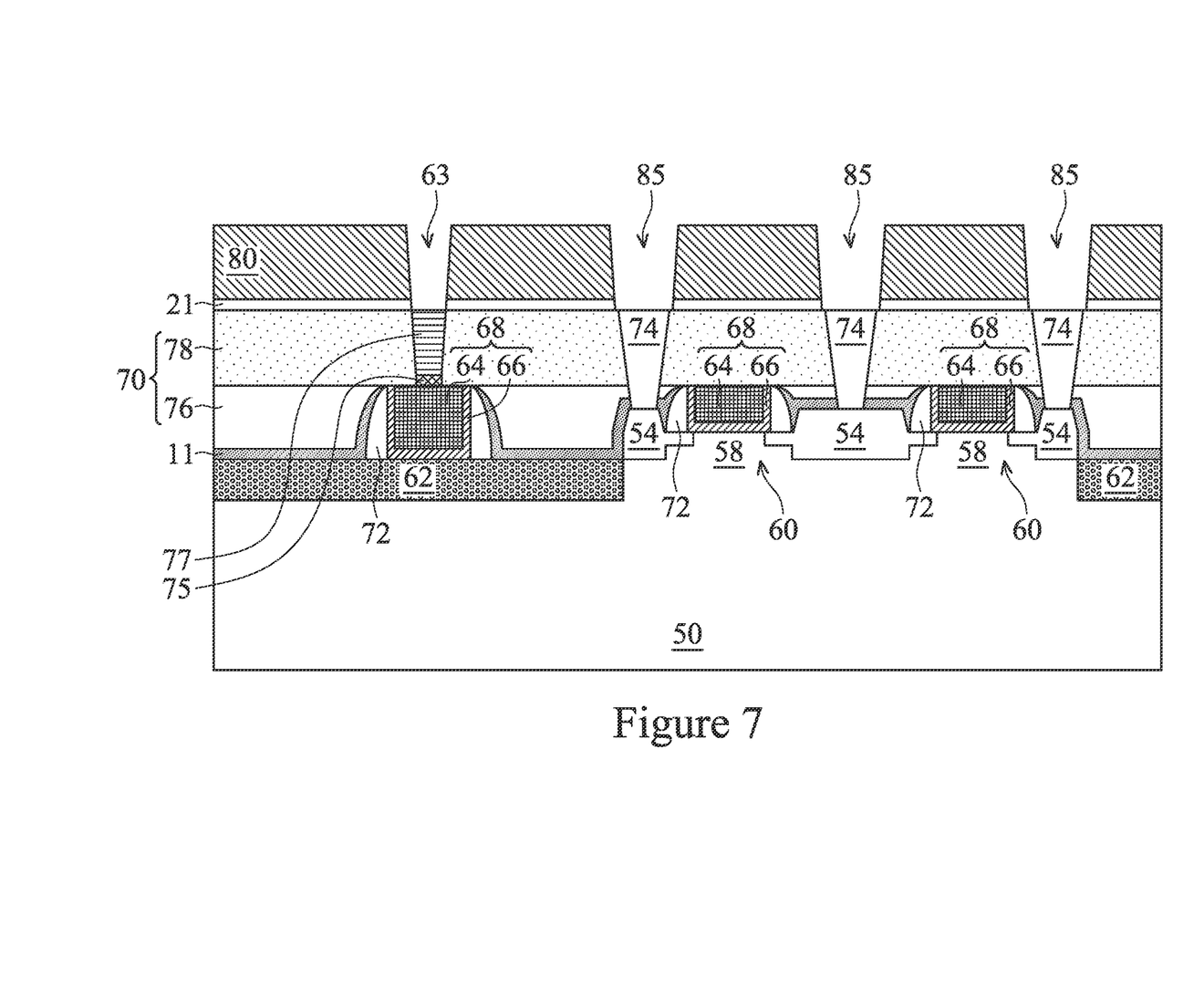

FIG. 7 illustrates one or more second openings 85 extending through the ILD$_U$ 80 and the ESL 21 to expose an underlying conductive feature, such as the top surface of contact plugs 74. The dielectric layers ILD$_U$ 80 and ESL 21 may be patterned to form the second openings 85 using a patterned mask, such as a patterned photoresist layer (not shown) to expose a portion of the top surface of the ILD$_U$ 80 located vertically above the contact plugs 74. A two-step etching process using (e.g., anisotropic RIE) may be performed to etch the source/drain contact via openings 85. The etchants used in the first step may remove the exposed ILD$_U$ 80 and stop on the ESL 21. Once the ESL 21 is exposed, the etchants may be switched in the second step to remove the ESL 21 and stop on an exposed conductive top surface of the contact plugs 74. The patterned mask may be removed after the etch process is complete using, for example, an ashing technique to remove a photoresist layer.

As illustrated in FIG. 7, the bottom surface of the second openings 85 has been formed at approximately the same depth as the second conductive material 77 in the first opening 63. Roughly equalizing the depths of all the openings in ILD$_U$ 80 by inserting the second conductive material 77 of appropriate thickness to partially fill the first opening 63 enhances the gap-fill capability of the subsequent deposition step used to simultaneously fill the remaining portion of the first opening 63 and the second openings 85. In some embodiments, a single selective deposition technique is used where the conductive fill material is formed on the conductive bottom surface and grows vertically. If a pair of closely spaced openings has substantially different depths, then the shallower opening fills earlier, after which the fill material may encroach laterally over the top aperture of the adjacent deep opening. This may result in a constriction at the top of the deep opening that blocks reactants and increases the possibility of forming void-defects. The partial-fill using the second conductive material 77 may reduce/eliminate this mechanism for an incomplete fill occurring in the openings in ILD$_U$ 80 illustrated in FIG. 7.

Figure 8:
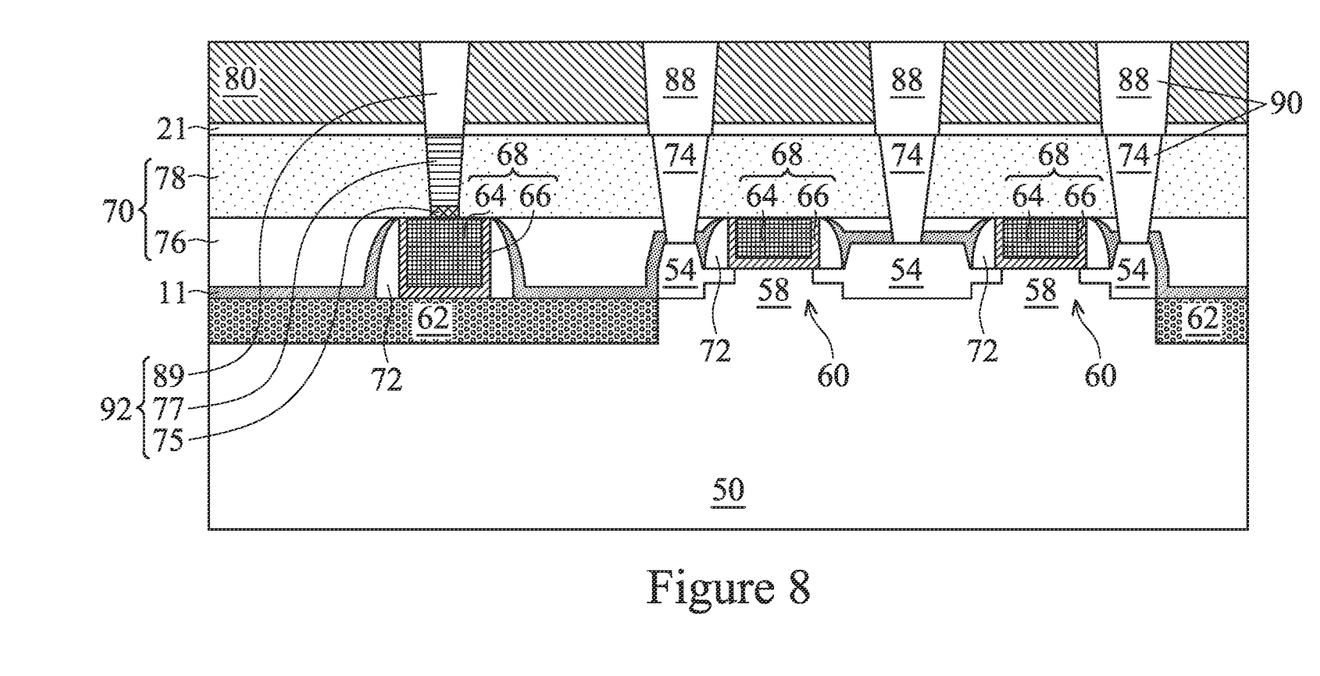

In FIG. 8, a third conductive material 88/89 has been deposited to simultaneously form the source/drain contact vias 88 and the gate contact via 89. In the example illustrated in FIG. 8, the third conductive material 88/89 may be polycrystalline tungsten. The third conductive material 88/89 may be grown vertically by using a selective CVD technique without forming any conductive liner, which may allow for a lower resistance contact. The selective deposition of polycrystalline tungsten may use WF$_6$ or WCl$_5$ as a precursor. Other similar precursor chemicals of the type WF$_x$ or WCl$_x$ may also be used. The precursor gas may be mixed with H$_2$ in a ratio of about 0.1% to about 1.5%, at a pressure of about 1 Torr to about 50 Torr, and tungsten formed at a temperature of about 200° C. to about 400° C., by a reduction reaction: WF$_6$+3H$_2$→W+6HF or, 2WCl$_5$+5H$_2$→2 W+5HCl. In the embodiment illustrated in FIG. 8, the tungsten may be formed substantially selectively over the contact plugs 74 and the second conductive material 77 because the reduction reaction requires hydrogen atoms (or hydrogen radicals) formed by dissociation of H$_2$ which occurs favorably on metallic surfaces relative to dielectric surfaces. Other metals, such as Co, or Ru may also be used as the third conductive material 88/89 and deposited using a selective CVD technique. It is also understood that while, in the example illustrated in FIG. 8, the selective CVD technique has been used to form the source/drain and gate contact via structures 88 and 89, respectively, in some other embodiments, other deposition methods such as, ALD, or multiple cycles of successive deposition and etch process steps, or a combination thereof, may be used to form a similar structure. After the deposition of the third conductive material 88/89 is complete, any excess conductive material over the dielectric surface of the ILD$_U$ 80 may be removed by a suitable planarization technique (e.g., by CMP) thereby forming both the source/drain contact vias 88 and the gate contact via 89 inlaid in ILD$_U$ 80, as illustrated in FIG. 8.

FIG. 8 illustrates the vertical interconnect structures that may be used to electrically and physically connect electrodes of a FinFET (e.g., the FinFETs 60) and a subsequently formed $M_1$ line, in accordance with some embodiments. The source/drain contact 90 comprises two conductive features: the third conductive material 88 (e.g., a source/drain contact via 88) stacked vertically above the source/drain contact plug 74 making an electrical connection to, e.g., a source/drain electrode 54. The gate contact 92 comprises three conductive features stacked vertically over each other: the third conductive material 89 (e.g., a gate contact via) formed above the second conductive material 77, and the first conductive material 75 positioned below the second conductive material 77. In the embodiments described herein, none of the conductive materials used in the vertical stack forming the gate contact 92 include a conductive liner. In some other embodiments, the deposition processes and materials may need conductive liners to prevent the deposited conductive material from detaching from the walls of the first opening 63 or out-diffusing into the surrounding dielectric. As explained above, eliminating the need for a conductive liner helps in reducing the resistance of the conductive vertical stack, thereby helps in forming a low-$R_c$ contact, particularly when the diameter of the contact is small. The first conductive material 75 makes a physical and electrical connection to, e.g., a conductive gate layer 64. In the illustration in FIG. 8, the electrical connection to the conductive gate layer 64 is disposed over a portion of the STI region 62. It is implied that the gate contact 92 and the conductive gate layer 64 in FIG. 8 are connected to the gate electrode of a FinFET, similar to the conductive gate layers 64 of FinFETs 60 shown over the fin 58 at the right side of FIG. 8.

Figure 9:
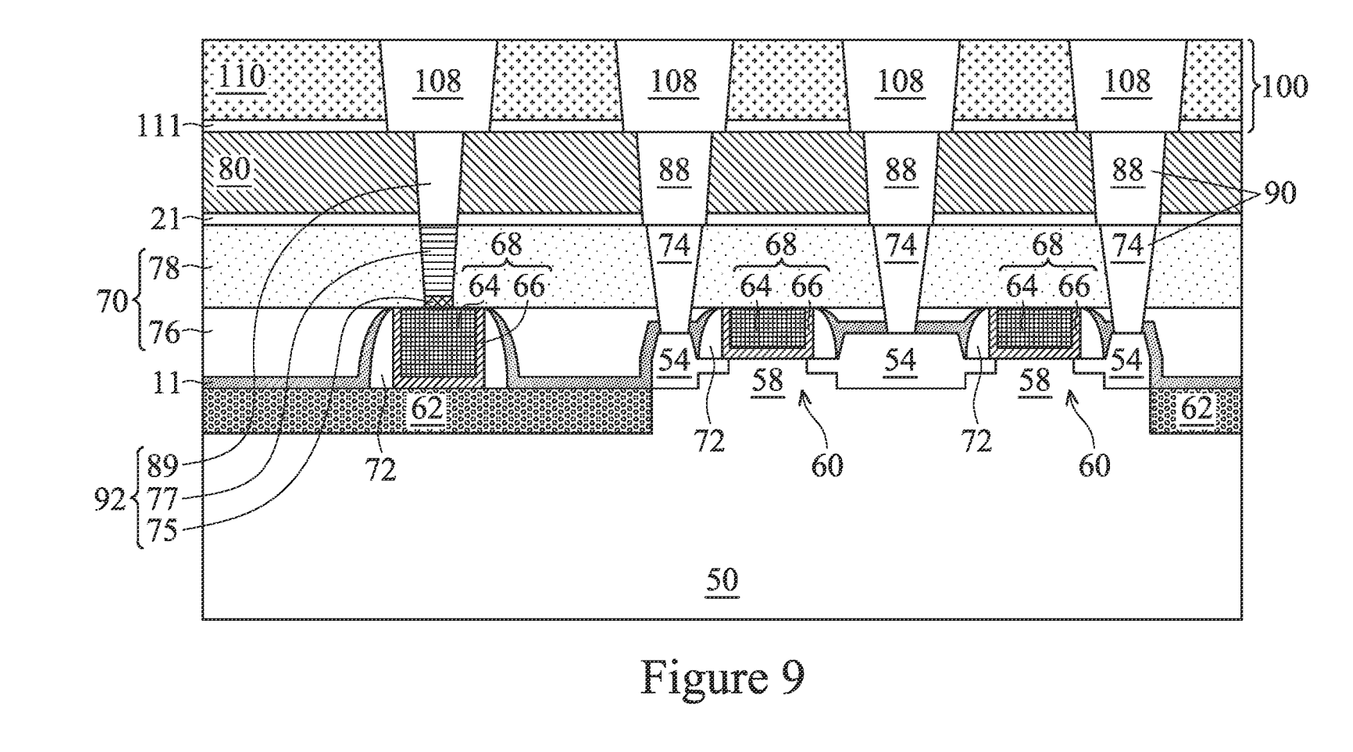

FIG. 9 illustrates a process flow that may be used to form a metal-1 (M1) interconnect level 100 over the $ILD_U$ 80. In some embodiments as illustrated in FIG. 9, the conductive elements of the M1 interconnect level 100 may comprise laterally conducting lines (e.g., the $M_1$ lines 108) and omit forming vertically conducting vias. An etch-stop layer (ESL) 111 may be deposited over the $ILD_U$ 80, and a first intermetal dielectric ($IMD_1$) 110 comprising one or more dielectric layers may be deposited over the ESL 111. The ESL 111 and the $IMD_1$ 110 may be formed using materials and processes similar to those used for the ESL 21 and the $ILD_U$ 80, described above with reference to FIG. 2. Appropriate photolithography and etching techniques (e.g., anisotropic RIE employing fluorocarbon chemistry) may be used to pattern the $IMD_1$ 110 to form openings for the $M_1$ lines 108. The openings for the $M_1$ lines 108 may be longitudinal trenches extending through the $IMD_1$ 110 to expose a top conductive surface of the source/drain contact vias 88 and the gate contact vias 89. The etching technique may utilize multiple steps. For example, a first main etch step may remove a portion of the dielectric material of $IMD_1$ layer 110 and stop on the ESL 111. Then, the etchants may be switched to remove dielectric material of ESL 111. Multiple masks may also be used.

Still referring to FIG. 9, one or more conductive materials may be deposited to fill the trenches forming the $M_1$ lines 108. The openings may be first lined with a conductive diffusion-barrier material and then filled with a conductive fill material deposited over the conductive diffusion barrier liner. In some embodiments, a thin conductive seed layer may be deposited over the conductive diffusion-barrier liner to help initiate an ECP deposition step that fills the openings with a conductive fill material. The conductive diffusion-barrier liner may comprise one or more layers of TaN, Ta, TiN, Ti, Co, or the like, or combinations thereof. The conductive fill layer may comprise metals, such as Cu, Al, W, Co, Ru, or the like, or combinations thereof, or multilayers thereof. The conductive materials used in forming the $M_1$ lines 108 may be deposited by any suitable method, for example, CVD, PECVD, PVD, ALD, PEALD, ECP, electroless plating and the like. In some embodiments, the conductive seed layer may be of the same conductive material as the conductive fill layer and deposited using a suitable deposition technique (e.g., CVD, PECVD, ALD, PEALD, or PVD, or the like). Any excess conductive material over the $IMD_1$ 110 outside of the openings may be removed by a planarizing process (e.g., a CMP process) thereby forming a top surface of the dielectric regions of $IMD_1$ 110 that is substantially coplanar with a top surface of the conductive regions of $M_1$ lines 108. Multiple interconnect levels may be formed above the metal-1 interconnect level illustrated in FIG. 9.

The disclosure describes structures forming vertically conducting low-$R_c$ gate contacts (e.g., the gate contact 92) to connect a conductive gate layer 64 to a respective $M_1$ line 108 above. It is understood that aspects of the embodiments described in this disclosure may be used to form other low-resistance vertical conductive elements, such as contacts to the source/drain electrodes of FinFETs. The embodiments describe fabrication of gate contact structures (e.g., the gate contact 92) comprising multiple conductive layers formed in a vertical stack using a multi-step deposition process. The vertical conductive stack does not include any conductive liner (often used as an adhesive layer) along the sides of the stack. This reduces the $R_c$ of the gate contact 92 because the resistivity of the liner material is generally higher than that of the bulk conductive materials used to form the vertical conductive stack.

Embodiments such as those disclosed herein provide methods to simultaneously fill the gate contact openings 63 (see FIG. 3) and the relatively shallow source/drain contact via openings 85 (see FIG. 5). The methods involve multi-step gap-fill processes partially filling deeper openings such that depths of the partially filled openings match a depth of shallower openings, thereby allowing a single final deposition step of the multi-step gap-fill process to fill both openings simultaneously with a reduced occurrence of void defects, as described earlier. A single planarization step following the deposition of the final conductive fill-layer (e.g., the primary metal 88/89) may be used to inlay both the gate contacts 92 and the source/drain contacts 90, thereby lowering manufacturing cost.

The contact structures and methods described in this disclosure provide advantages of lowering $R_c$, reducing processing cost, and enhancing manufacturing yield by reducing incomplete gap-fill of closely spaced contacts, as explained above, thereby enhancing the capability of scaling integrated circuits to smaller dimensions and higher density.

In an embodiment, a method of forming a semiconductor structure includes forming a first dielectric layer on a substrate; forming a first conductive feature in the first dielectric layer, the first conductive feature being electrically connected to a first conductive region; forming a second dielectric layer over the first dielectric layer and the first conductive feature; forming a first opening extending through the first dielectric layer and the second dielectric layer exposing a second conductive region; and forming a first conductive material in the first opening; forming a second conductive material over the first conductive material in the first opening; forming a patterned mask over the second dielectric layer, the patterned mask covering the first opening and exposing a region of the second dielectric layer vertically over the first conductive feature; forming a second opening in the second dielectric layer using the patterned mask as a mask, the second opening exposing a portion of the first conductive feature; removing the patterned mask; and depositing a third conductive material in the first opening and the second opening, the third conductive material filling the first opening and the second opening. In an embodiment, the method further includes removing excess portions of the third conductive material from a top surface of the second dielectric layer by a planarization technique. In an embodiment, the patterned mask overlies the second conductive material and fills the first opening while forming the second opening. In an embodiment, forming the second conductive material includes performing an ALD process. In an embodiment, forming the first conductive material includes forming a layer of the first conductive material along an upper surface of the second dielectric layer, along sidewalls of the first opening, and along a bottom of the first opening, and removing the first conductive material from the upper surface of the second dielectric layer and along the sidewalls of the first opening. In an embodiment, removing the first conductive material includes removing the first conductive material from the upper surface of the second dielectric layer and, after removing the first conductive material from the upper surface of the second dielectric layer, removing the first conductive material from the sidewalls of the second dielectric layer. In an embodiment, an upper surface of the second conductive material is level with an upper surface of the first dielectric layer.

In an embodiment, a method of forming a semiconductor structure includes forming a first dielectric layer on a substrate; forming a first conductive feature in the first dielectric layer; forming a second dielectric layer over the first dielectric layer and the first conductive feature; forming a first opening extending through the first dielectric layer and the second dielectric layer; depositing a first conductive material along a bottom of the first opening, sidewalls of the second dielectric layer in the first opening being free of the first conductive material; forming a second conductive material over the first conductive material, wherein at least a portion of the sidewalls of the second dielectric layer in the first opening is free of the second conductive material; forming a patterned mask over the second dielectric layer, the patterned mask covering the first opening and exposing a region of the second dielectric layer vertically over the first conductive feature; removing a portion of the second dielectric layer from the region exposed by the patterned mask, removing the portion of the second dielectric layer forming a second opening exposing a portion of the first conductive feature; removing the patterned mask; and depositing a third conductive material, the third conductive material filling the first opening and the second opening. In the embodiment the first conductive feature and the third conductive material in the second opening form a first conductive element; the first conductive material, the second conductive material, and the third conductive material in the first opening form a second conductive element. In an embodiment, the second conductive material contacts the second dielectric layer. In an embodiment, the third conductive material contacts the second dielectric layer. In an embodiment, an upper surface of the second conductive material is substantially level with an upper surface of the first dielectric layer.

In an embodiment, a semiconductor structure includes a first dielectric layer on a substrate; a second dielectric layer over the first dielectric layer; a first conductive element extending through the first dielectric layer and the second dielectric layer; the first conductive element includes: a first conductive feature in the first dielectric layer connected to a first electrode, and a second conductive feature in the second dielectric layer connected to the first conductive feature; and a second conductive element extending through the first dielectric layer and the second dielectric layer, the second conductive element includes: a lower conductive layer connected to a second electrode, and an intermediate conductive layer over the lower conductive layer, and an upper conductive layer in the second dielectric layer. In the second conductive element, the intermediate conductive layer is interposed between the upper conductive layer and the lower conductive layer. In an embodiment, a conductive material in the upper conductive layer of the second conductive element is a same material as the second conductive feature of the first conductive element. In an embodiment, the upper surfaces of the upper conductive layer, the second conductive feature, and the second dielectric layer are planar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a first dielectric layer on a substrate;
   a second dielectric layer over the first dielectric layer;
   a first conductive element extending through the first dielectric layer and the second dielectric layer, the first conductive element comprising:
   a first conductive feature in the first dielectric layer connected to a first electrode; and
   a second conductive feature in the second dielectric layer connected to the first conductive feature; and
   a second conductive element extending through the first dielectric layer and the second dielectric layer, the second conductive element comprising:
   a lower conductive layer connected to a second electrode, the lower conductive layer being in the first dielectric layer; and
   an intermediate conductive layer over the lower conductive layer, the intermediate conductive layer being in the first dielectric layer; and
   an upper conductive layer in the second dielectric layer, wherein the intermediate conductive layer is interposed between the upper conductive layer and the lower conductive layer, wherein a conductive material in the upper conductive layer of the second conductive element is a same material as the second conductive feature of the first conductive element, wherein upper surfaces of the upper conductive layer, the second conductive feature, and the second dielectric layer are planar, wherein the second electrode is a gate of a transistor.

2. The semiconductor structure of claim 1, wherein the first electrode is a source/drain region of the transistor.

3. The semiconductor structure of claim 1, wherein the lower conductive layer contacts the first dielectric layer.

4. The semiconductor structure of claim 3, wherein the intermediate conductive layer contacts the first dielectric layer.

5. The semiconductor structure of claim 4, wherein the upper conductive layer contacts the second dielectric layer.

6. The semiconductor structure of claim 1, wherein sidewalls of the upper conductive layer are completely free of the lower conductive layer.

7. The semiconductor structure of claim 1, wherein the lower conductive layer comprises a first sublayer and a second sublayer.

8. The semiconductor structure of claim 7, wherein the first sublayer comprises Ti layer, and wherein the second sublayer comprises a TiN layer.

9. A semiconductor structure comprising:
   a first dielectric layer on a substrate;
   a second dielectric layer over the first dielectric layer; and
   a first conductive element and a second conductive element extending through the first dielectric layer and the second dielectric layer, wherein the first conductive element contacts a first conductive feature, the first conductive feature being below the first dielectric layer, wherein the second conductive element contacts a second conductive feature, the second conductive feature being below the first dielectric layer, wherein the first conductive element has a first upper layer and a first lower structure below the first upper layer, the second conductive element has a second upper layer and a second lower structure below the second upper layer, wherein the first upper layer and the second upper layer have a same material composition, wherein the first lower structure has fewer layers than the second lower structure, wherein the first conductive feature is a source/drain region of a transistor, and wherein the second conductive feature is a gate of the transistor.

10. The semiconductor structure of claim 1, wherein the second electrode is spaced apart from the first dielectric layer, and wherein the first electrode physically contacts the first dielectric layer.

11. The semiconductor structure of claim 9, wherein the second conductive element comprises a tungsten layer below the second upper layer.

12. The semiconductor structure of claim 11, wherein the second conductive element comprises a TiN layer below the tungsten layer, wherein the tungsten layer and the TiN layer directly contacts the first dielectric layer.

13. The semiconductor structure of claim 9, wherein the first upper layer and the second upper layer comprises a polycrystalline tungsten layer.

14. The semiconductor structure of claim 9, wherein the second conductive element comprises a lower conductive layer having a thickness in a range from 2 nm to 5 nm directly on the second conductive feature.

15. The semiconductor structure of claim 9, wherein the first lower structure has a bottom surface below a bottom surface of the first dielectric layer, and wherein the second lower structure has a bottom surface coplanar with the bottom surface of the first dielectric layer.

16. A semiconductor structure comprising:
   a first conductive feature;
   a second conductive feature;
   a first dielectric layer over the first conductive feature and the second conductive feature, the first conductive feature being spaced apart from the first dielectric layer, the second conductive feature physically contacting the first dielectric layer;
   a second dielectric layer over the first dielectric layer;
   a first conductive element extending from an upper surface of the second dielectric layer to the first conductive feature, wherein the first conductive element comprises a first lower conductive layer and a first upper conductive layer over the first lower conductive layer; and
   a second conductive element extending from the upper surface of the second dielectric layer to the second conductive feature, wherein the second conductive element comprises a second lower conductive layer and a second upper conductive layer over the second lower conductive layer, wherein the first upper conductive layer and the second upper conductive layer comprise a same material layer, wherein the first lower conductive layer is thicker than the second lower conductive layer.

17. The semiconductor structure of claim 16, wherein the second lower conductive layer comprises an intermediate layer, wherein the intermediate layer contacts the first dielectric layer.

18. The semiconductor structure of claim 17, wherein the second lower conductive layer contacts the first dielectric layer.

19. The semiconductor structure of claim 16, wherein the second upper conductive layer does not extend into the first dielectric layer.

20. The semiconductor structure of claim 16, wherein the first upper conductive layer does not extend into the first dielectric layer.

* * * * *